United States Patent [19]

Hunt et al.

[11] 4,042,449

[45] Aug. 16, 1977

[54] METHOD OF MAKING A RETICLE-LENS

[75] Inventors: Robert E. Hunt, China Lake; Kenneth L. Moore, Ridgecrest, both of Calif.

[73] Assignee: The United States of America as represented by the Secretary of the Navy, Washington, D.C.

[21] Appl. No.: 724,448

[22] Filed: Sept. 20, 1976

Related U.S. Application Data

[62] Division of Ser. No. 598,896, July 24, 1975, Pat. No. 3,999,301.

[51] Int. Cl.² ................. C03C 15/00; C03C 17/00
[52] U.S. Cl. .................................. 156/651; 65/30 R; 65/32; 65/31; 65/60 A; 65/60 D; 156/656; 156/665; 156/667
[58] Field of Search ............... 65/30 R, 31, 32, 60 A, 65/60 D; 156/651, 656, 665, 667

[56] References Cited

U.S. PATENT DOCUMENTS

| 3,370,948 | 2/1968 | Rosenbauer | 65/31 X |
| 3,666,642 | 5/1972 | Alwan et al. | 156/665 X |
| 3,808,069 | 4/1974 | Caffrey et al. | 156/651 |
| 3,857,689 | 12/1974 | Koizumi et al. | 65/60 A X |

Primary Examiner—S. Leon Bashore
Assistant Examiner—Frank W. Miga
Attorney, Agent, or Firm—R. S. Sciascia; Roy Miller; Thomas W. Hennen

[57] ABSTRACT

A method of producing an optical reticle and the reticle produced thereby. A thin layer of aluminum is deposited on the face of a sapphire substrate and a reticle pattern is chemically etched therein. The system is then exposed to air at an elevated temperature for approximately one hour to oxidize the remaining aluminum layer. A film of titanium is next placed over the rough aluminum oxide as by sputtering, for example, and the excess titanium is etched away by the same pattern to produce the finished reticle.

3 Claims, 7 Drawing Figures

METHOD OF MAKING A RETICLE-LENS

CROSS REFERENCE TO RELATED APPLICATION

This application pertains to an invention disclosed in applicants' copending parent application Ser. No. 598,896 filed July 24, 1975, now U.S. Pat. No. 3,999,301, issued Dec. 28, 1976 and is a divisional application.

BACKGROUND OF THE INVENTION

This invention relates to reticles employed in optical systems and particularly to reticles employed in infra-red detector systems, and most particularly to a reticle-lens system which is effective in reducing back reflectance noise.

In a missile seeker system, for example, in which an infra-red detector is used as a guidance feature, a reticle is generally placed in the line of sight of the missile optics before the detecting circuitry. In prior reticles a problem existed when back reflectance in the reticle-lens system caused undersirable background noise.

SUMMARY OF THE INVENTION

According to the present invention, reflectance background noise is reduced to a minimum by successively depositing a thin layer of aluminum on the face of the sapphire reticle substrate, chemically etching a reticle pattern in the aluminum, oxidizing the remaining aluminum and, finally depositing a film of titanium on the aluminum oxide before etching the final reticle pattern.

DESCRIPTION AND OPERATION

Figure 1:
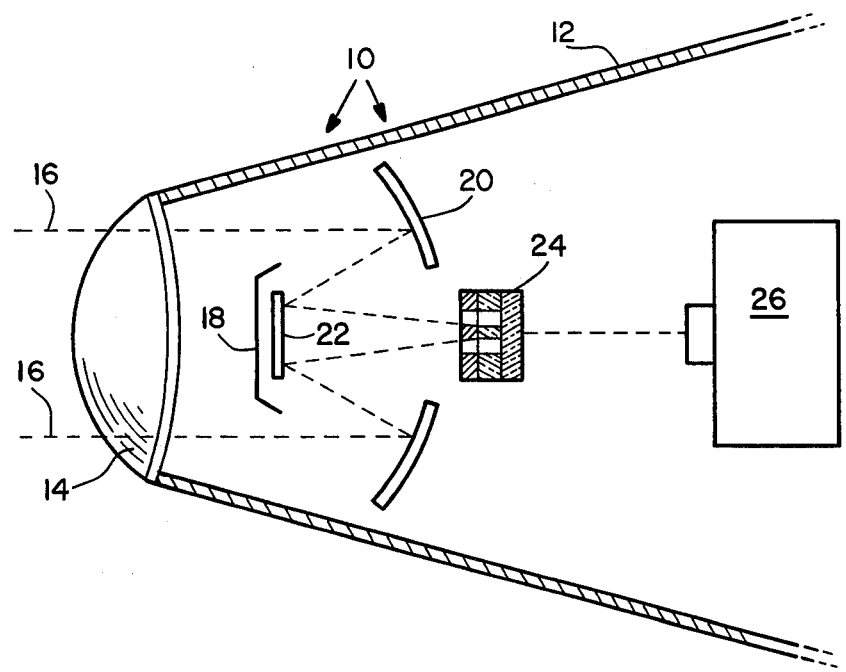
FIG. 1 is a schematic side elevation partly in section of a missile nose cone employing a reticle-lens system according to the present invention.

A typical guided missile nose cone is generally illustrated at 10 in FIG. 1. The tapered portion of the cone at 12 may be of metal or plastic and, in some applications, may be partially or totally transparent. A transparent window 14 is provided on the forward end of the missile for receiving radiation energy as indicated by dotted lines 16. A sun shield 18 is generally provided centrally of the optical path for obvious reasons and a plurality of optical surfaces 20, 22 are used to focus the received energy waves through a reticle 24 to a detector system 26.

Figure 2:
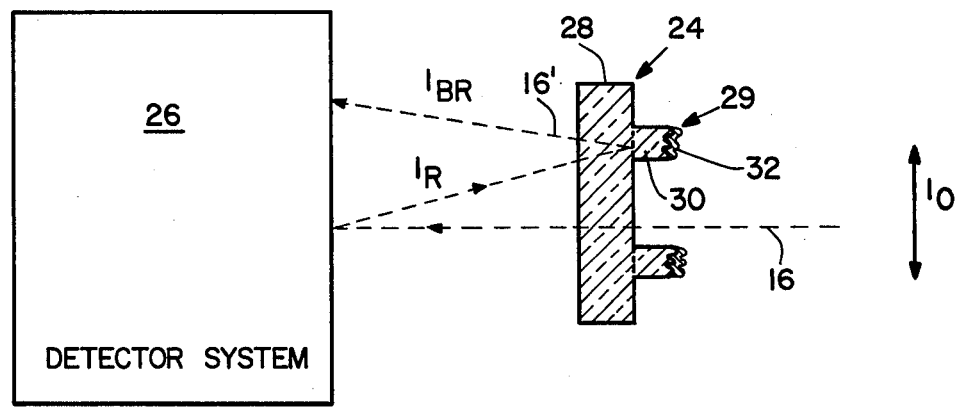
FIG. 2 is a schematic diagram of a portion of FIG. 1 illustrating details of the reticle-lens system.

As shown in FIG. 2, the reticle 24 is formed by a transparent substrate 28 having an opaque pattern 29 affixed thereto. In a known prior art device the pattern 29 consisted of a plating of titanium metal. According to the present invention the pattern 29 consists of a layer of aluminum oxide 30 overlayed by a film of titanium 32. When the energy waves from the target or source ($I_0$) travel along the path 16 to the detector system, a certain portion of the energy waves are reflected ($I_R$) and pass back through the reticle or are back reflected ($I_{BR}$) along path 16'. In prior art devices, for example, this back reflectance was on the order of 60 percent of $I_R$. This back reflectance, when received by the detector system, caused noise problems in the detector system. Reticles manufactured according to the present invention have been shown to decrease back reflectance in these systems by about 50 percent.

Figure 3:
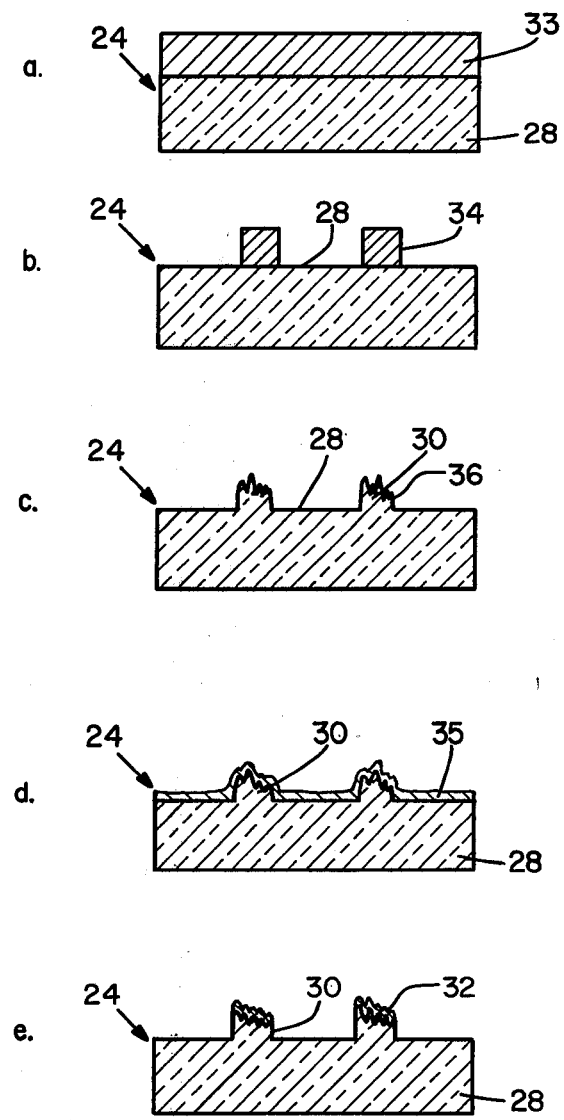
FIGS. 3A to 3E are cross-sectional views of the reticle system illustrating the steps in the process of manufacture.

FIGS. 3A through 3E illustrate a process by which the reticle of FIG. 2 may be manufactured. The sapphire substrate 28 is first coated with a thin layer of aluminum 33 as shown in FIG. 3A. Portions of the aluminum layer 33 are then etched away to form a reticle pattern 34 as shown in FIG. 3B. The reticle is then exposed to air at an elevated temperature (around 820° C) for about one hour to oxidize the remaining aluminum layer 33 so that it has a roughened surface 36 as shown in FIG. 3C. A titanium film 35 is next coated by sputtering, for example, over the rough aluminum oxide 30 as shown in FIG. 3D and finally the reticle pattern is etched into the titanium film 35 by removing a titanium film portion other that the oxidized reticule portion thereby producing the finished reticle as indicated in FIG. 3E.

After the fabrication as set forth above, the entire reticle system is preferably coated with the usual antireflection coating of magnesium fluoride. The optimum thickness of this coating is $\lambda/4$ or ¼ the optical wavelength of the radiation being received for processing by the detector system.

Obviously any number of modifications and variations of the present invention are possible within the teachings of the above disclosure. It is therefore, to be understood that, within the scope of the appended claims, the invention may be practiced otherwise than as specifically described.

What is claimed is:

1. In a method for producing a reticle having a sapphire substrate underlying a titanium reticle pattern, the improvement which comprises:
    depositing a layer of aluminum onto said sapphire substrate;
    forming said aluminum to define a reticle pattern;
    oxidizing said aluminum reticle pattern;
    placing a film of titanium upon said sapphire substrate and said aluminum oxide to form an opague reticle pattern; and
    removing said titanium film from other portions of said sapphire substrate than the oxidized reticle pattern portion.

2. The method of claim 1 wherein the oxidizing step comprises:
    placing said aluminum reticle pattern in an oxidizing atmoshpere at an elevated temperature for a predetermined length of time.

3. The method of claim 2 wherein said oxidizing step is performed at about 820° C for about 1 hour.

* * * * *